United States Patent
Bossu et al.

(10) Patent No.: US 9,488,996 B2
(45) Date of Patent: Nov. 8, 2016

(54) BIAS TECHNIQUES AND CIRCUIT ARRANGEMENTS TO REDUCE LEAKAGE CURRENT IN A CIRCUIT

(71) Applicant: QUALCOMM Incorporated, San Diego, CA (US)

(72) Inventors: Frederic Bossu, San Diego, CA (US); Ahmed Abdel Monem Youssef, San Diego, CA (US); Tsai-Pi Hung, San Diego, CA (US); Prasad Srinivasa Siva Gudem, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/691,461

(22) Filed: Apr. 20, 2015

(65) Prior Publication Data

US 2015/0346743 A1    Dec. 3, 2015

Related U.S. Application Data

(60) Provisional application No. 62/004,740, filed on May 29, 2014.

(51) Int. Cl.
  *G05F 1/46*  (2006.01)
  *H02H 9/04*  (2006.01)
  *H01L 27/02*  (2006.01)

(52) U.S. Cl.
  CPC .............. *G05F 1/46* (2013.01); *H01L 27/0251* (2013.01); *H01L 27/0255* (2013.01); *H01L 27/0266* (2013.01); *H02H 9/045* (2013.01); *H02H 9/046* (2013.01)

(58) Field of Classification Search
  CPC ..... G05F 1/46; G05F 1/571; H01L 27/0251; H01L 27/0255; H01L 27/0266; H02H 9/045; H02H 9/046; H02H 9/041; H02H 9/043
  See application file for complete search history.

(56) References Cited

U.S. PATENT DOCUMENTS

| | | | |
|---|---|---|---|
| 6,144,542 A * | 11/2000 | Ker | H01L 27/0292 361/111 |
| 7,489,584 B2 | 2/2009 | Dang et al. | |
| 7,851,947 B2 | 12/2010 | Cassia et al. | |
| 8,139,436 B2 | 3/2012 | Chen et al. | |
| 8,228,651 B2 * | 7/2012 | Kim | H01L 27/0266 361/56 |
| 8,958,186 B2 * | 2/2015 | Lefferts | H02H 9/046 361/56 |
| 2006/0232307 A1 | 10/2006 | Kanno et al. | |
| 2008/0130181 A1 | 6/2008 | Pinna et al. | |
| 2011/0102072 A1 | 5/2011 | Idgunji et al. | |
| 2012/0002334 A1 | 1/2012 | Kosonocky et al. | |
| 2013/0050885 A1 | 2/2013 | Chen et al. | |
| 2013/0107651 A1 | 5/2013 | Singh | |
| 2013/0328533 A1 | 12/2013 | Idgunji et al. | |
| 2014/0126090 A1 | 5/2014 | Mozak et al. | |

FOREIGN PATENT DOCUMENTS

| | | |
|---|---|---|
| JP | S59138354 A | 8/1984 |
| WO | 2012125179 A1 | 9/2012 |

OTHER PUBLICATIONS

International Search Report and Written Opinion—PCT/US2015/026922—ISA/EPO—Jul. 1, 2015, 12 pages.

* cited by examiner

*Primary Examiner* — Jung Kim (74) *Attorney, Agent, or Firm* — Toler Law Group, PC (57) ABSTRACT

An apparatus includes an input/output (I/O) pin and an electrostatic discharge device. The electrostatic discharge device is coupled to the I/O pin and to a voltage regulator.

20 Claims, 9 Drawing Sheets

BIAS TECHNIQUES AND CIRCUIT ARRANGEMENTS TO REDUCE LEAKAGE CURRENT IN A CIRCUIT

I. CROSS-REFERENCE TO RELATED APPLICATIONS

The present application claims priority from U.S. Provisional Patent Application No. 62/004,740, filed May 29, 2014 and entitled "BIAS TECHNIQUES AND CIRCUIT ARRANGEMENTS TO REDUCE LEAKAGE CURRENT IN A CIRCUIT," the content of which is incorporated by reference in its entirety.

II. FIELD

The present disclosure relates generally to electronics, and more specifically to integrated circuits.

III. DESCRIPTION OF RELATED ART

As integrated circuit (IC) manufacturers move to smaller geometries to achieve increases in switching rates and decreases in power consumption, they continue to reduce the dimensions of the transistors, interconnections, and the layers in their ICs. The corresponding decreases in the physical dimensions make the ICs more likely to be damaged by an electrostatic discharge (ESD) event. Thus, some ICs are designed with internal ESD protection that allows them to tolerate ESD generated pulses consistent with handling prior to assembly or an ESD event after the ICs are assembled in an end user device.

The transition to smaller geometries also increases the importance of leakage current management in an IC design. Leakage current is current that flows when circuits within the IC are powered off. Leakage current also results from current that flows through ESD protection circuits or clamps that are connected between power supply and ground pins, which correspond to certain inputs and outputs of the IC. For example, a transition from a 65 nm manufacturing process to a 28 nm manufacturing process leads to an approximate ten-fold increase in leakage current due to the smaller transistor geometries.

Furthermore, to extend battery life in portable electronic devices it is desirable to reduce leakage current.

Some conventional power management techniques connect an integrated circuit to a separate switching mode power supply or a separate low-dropout regulator. The respective outputs of these supply devices are collapsed or reduced to ground when it is desired to conserve power. While these arrangements avoid or reduce leakage current, reconfiguration of the circuits that receive power from the separate supply devices, where reconfiguration includes a transition from an off or power conservation mode to an on or nominal power mode, generally requires high instantaneous currents and contributes to overall current leakage. Moreover, assigning dedicated switching mode power supplies or low-dropout regulators to ICs in an electronic device or module with multiple ICs increases a bill of materials and the size of the electronic device.

IV. BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

V. DETAILED DESCRIPTION

The word "exemplary" is used herein to mean "serving as an example, instance, or illustration." Any aspect described herein as "exemplary" is not necessarily to be construed as preferred or advantageous over other aspects.

Figure 1:
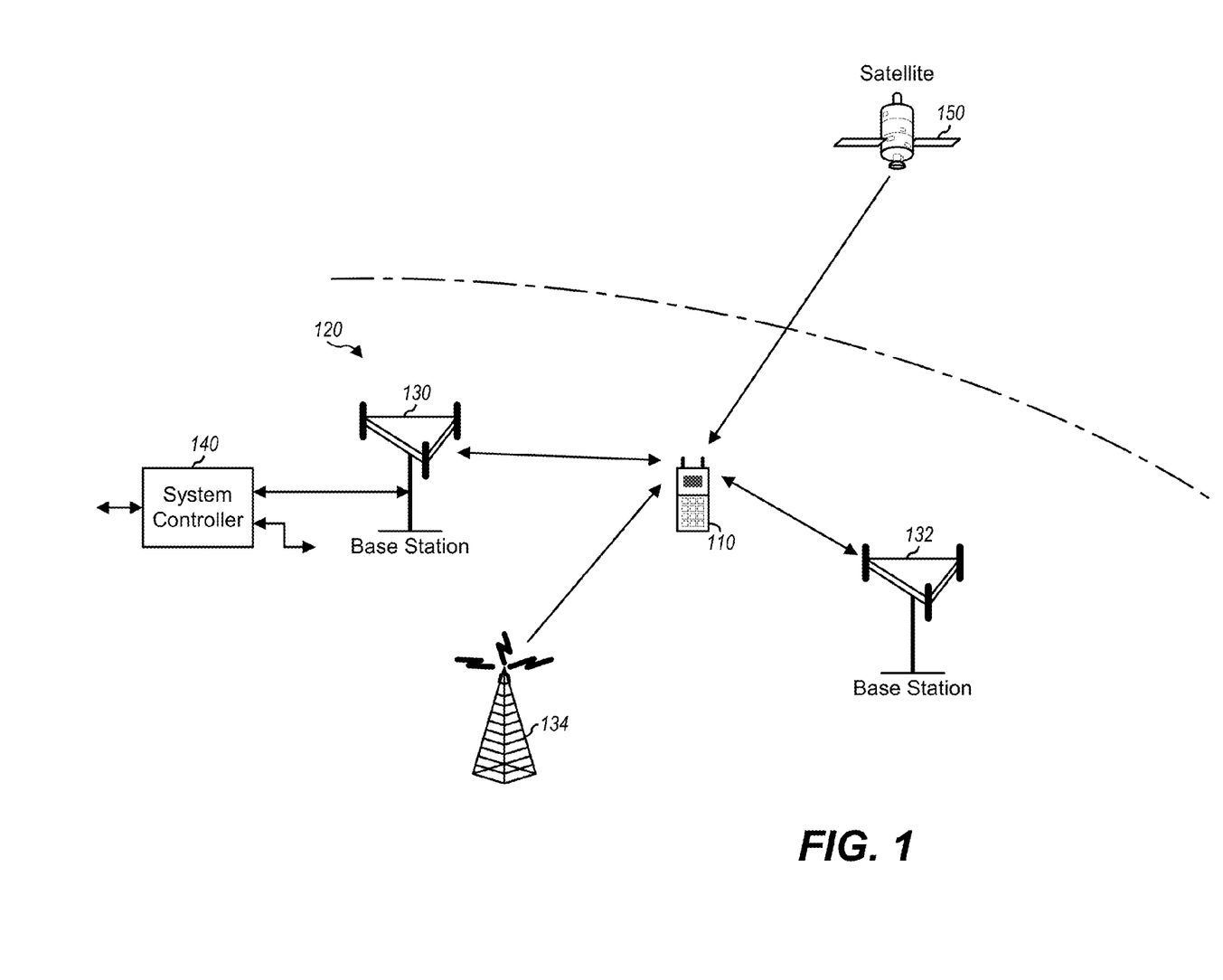
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Wireless device 110 may support carrier aggregation, which includes operation on multiple carriers. Carrier aggregation may also be referred to as multi-carrier operation. Wireless device 110 may be able to operate in a low-band (LB) frequency band group (e.g., a "band group" of one or more frequency bands in which a highest frequency included in the one or more frequency bands does not exceed 1000 megahertz (MHz)), a mid-band (MB) frequency band group (e.g., a band group of one or more frequency bands in which a lowest frequency included in the one or more frequency bands exceeds 1000 MHz and in which a highest frequency included in the one or more frequency bands does not exceed 2300 MHz), and/or high-band (HB) frequency band group (e.g., a band group of one or more frequency bands in which a lowest frequency included in the one or more frequency bands exceeds 2300 MHz). For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). In some implementations, each band may have a bandwidth that is less than or equal to 200 MHz and may include one or more carriers. Each carrier may cover up to 20 MHz in LTE. LTE Release 11 supports 35 bands, which are referred to as LTE/UMTS bands and are listed in 3GPP TS 36.101.

The wireless device 110 may include an input/output (I/O) pin and a voltage regulator that is configured to output a regulated voltage at a regulator output node. The wireless device 110 may also include an electrostatic discharge device that is coupled to the I/O pin and to the voltage regulator, such as described with respect to FIG. 2.

Figure 2:
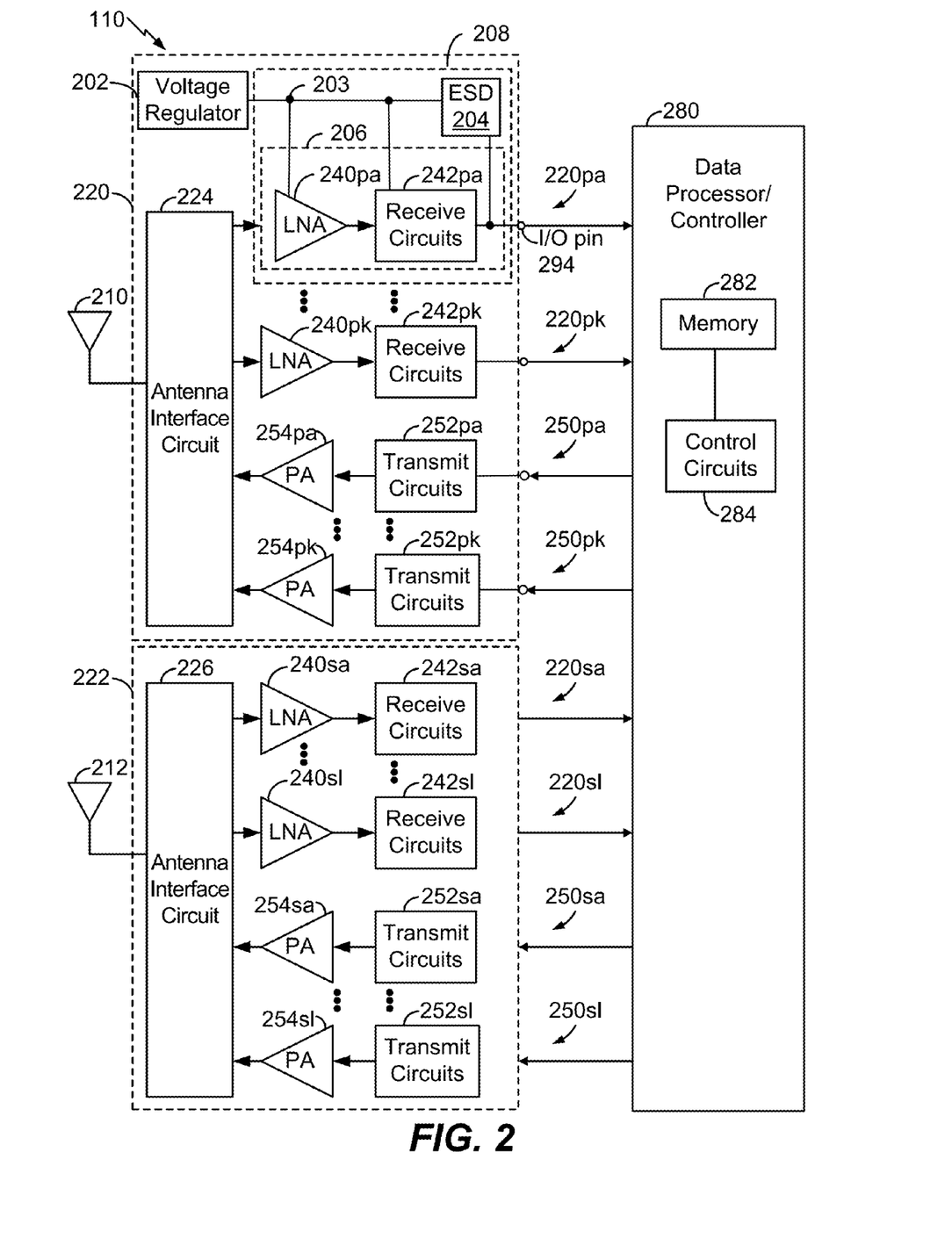
FIG. 2 is a diagram of components that may be used in the wireless device of FIG. 1.

FIG. 2 shows a block diagram of an exemplary design of the wireless device 110 in FIG. 1 that includes an ESD device 204 in a regulated voltage domain 208. In this exemplary design, the wireless device 110 includes a transceiver 220 coupled to a primary antenna 210, a transceiver 222 coupled to a secondary antenna 212, and a data processor/controller 280. The transceiver 220 includes multiple (K) receivers 230$pa$ to 230$pk$ and multiple (K) transmitters 250$pa$ to 250$pk$ to support multiple frequency bands, multiple radio technologies, carrier aggregation, etc. The transceiver 222 includes multiple (L) receivers 230$sa$ to 230$sl$ and multiple (L) transmitters 250$sa$ to 250$sl$ to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230$pa$ to 230$pk$ and 230$sa$ to 230$sl$ includes an LNA 240$pa$ to 240$pk$ and 240$sa$ to 240$sl$ and a receive circuit 242$pa$ to 242$pk$ and 242$sa$ to 242$sl$, respectively. For data reception, the primary antenna 210 receives signals from base stations and/or other transmitter stations and provides a received RF signal, which is routed through an antenna interface circuit 224 and presented as an input RF signal to a selected receiver (e.g., the receiver 230$pk$). In a similar manner, the secondary antenna 212 receives signals from base stations and/or other transmitter stations and provides a received RF signal, which is routed through an antenna interface circuit 226 and presented as an input RF signal to a selected receiver.

The antenna interface circuit 224 may include switches, duplexers, transmit filters, receive filters, matching circuits, etc. The description below assumes that the receiver 230$pk$ is the selected receiver. Within the receiver 230$pk$, an LNA 240$pk$ amplifies the input RF signal and provides an output RF signal.

The receive circuits 242$pk$ may downconvert the output RF signal from RF to baseband, amplify and filter the downconverted signal, and provide an analog input signal to the data processor/controller 280. The receive circuits 242$pk$ may include mixers, filters, amplifiers, matching circuits, an oscillator, a local oscillator (LO) generator, a phase locked loop (PLL), etc. Each remaining receiver 230$pa$, 230$sa$, 230$sl$ in the transceivers 220, 222 may operate in similar manner as the receiver 230$pk$.

In the exemplary design shown in FIG. 2, each transmitter 250$pa$ to 250$pk$ and 250$sa$ to 250$sl$ includes a transmit circuit 252$pa$ to 252$pk$ and 252$sa$ to 252$sl$ and a power amplifier (PA) 254$pa$ to 254$pk$ and 254$sa$ to 254$sl$, respectively. For data transmission, the data processor/controller 280 processes (e.g., encodes and modulates) data to be transmitted and provides an analog output signal to a selected transmitter. The description below assumes that the transmitter 250$pa$ is the selected transmitter. Within transmitter 250$pa$, the transmit circuits 252$pa$ amplify, filter, and upconvert the analog output signal from baseband to RF and provide a modulated RF signal. The transmit circuits 252$pa$ may include amplifiers, filters, mixers, matching circuits, an oscillator, an LO generator, a PLL, etc. A PA 254$pa$ receives and amplifies the modulated RF signal and provides a transmit RF signal. The transmit RF signal is routed through the antenna interface circuit 224 and transmitted via the primary antenna 210. Each remaining transmitter 250$pk$, 250$sa$, 25$sl$ in the transceivers 220, 222 may operate in similar manner as the transmitter 250$pa$.

FIG. 2 shows an exemplary design of receivers 230$pa$ to 230$pk$ and 230$sa$ to 230$sl$ and transmitters 250$pa$ to 250$pk$ and 250$sa$ to 250$sl$. A receiver and a transmitter may also include other circuits not shown in FIG. 2, such as filters, matching circuits, etc. All or a portion of the transceivers 220 and 222 may be implemented on one or more analog integrated circuits (ICs), RF ICs (RFICs), mixed-signal ICs, etc. For example, LNAs 240$pa$ to 240$pk$ and 240$sa$ to 240$sl$ and receive circuits 242$pa$ to 242$pk$ and 242$sa$ to 242$sl$ may be implemented on one module, which may be an RFIC, etc. The circuits in the transceivers 220 and 222 may also be implemented in other manners.

FIG. 2 illustrates that each of the receivers 230$pa$ to 230$pk$ and the transmitters 250$pa$ to 250$pk$ of the transceiver 220 may be coupled to the data processor/controller 280 via an input/output (I/O) pin, such as a representative I/O pin 294. The ESD device 204 is coupled between one or more pins, such as one or more of the I/O pins, illustrated as a representative pin 294, and voltage regulator output node 203 at an output of the voltage regulator 202. The voltage regulator 202 provides a regulated voltage at the voltage regulator output node 203 that may be used as a supply voltage for a cell to protect 206 that may include one or more circuits of the transceiver 220 that are within the regulated voltage domain 208. For example, one or more of the LNAs 240$pa$ to 240$pk$, one or more of the PAs 254$pa$ to 254$pk$, one or more of the receive circuits 242$pa$ to 242$pk$, one or more of the transmit circuits 252$pa$ to 252$pk$, or any combination thereof, may be coupled to the output of the voltage regulator 202.

During periods of inactivity at one or more of the circuits coupled to the voltage regulator 202, the voltage regulator 202 may enter a low-power mode and the voltage at the voltage regulator output node 203 may be reduced (e.g., may discharge to ground) to reduce power consumption due to leakage current at the inactive circuits in the voltage domain 208. By coupling the ESD device 204 to the voltage regulator output node 203, leakage current through the ESD device 204 may be avoided or reduced during periods of inactivity. As a result, power consumption due to leakage current through the ESD device 204 may be reduced as compared to a configuration where the ESD device 204 is coupled to a voltage supply of the transceiver 220 that remains energized during periods of inactivity. The transceiver 220 may include one or more additional ESD devices and/or circuits, such as described in further detail with respect to FIG. 4.

The data processor/controller 280 may perform various functions for wireless device 110. For example, the data processor/controller 280 may perform processing for data received via the receivers 230pa to 230pk and 230sa to 230sl and data to be transmitted via the transmitters 250pa to 250pk and 250sa to 250sl. The data processor/controller 280 may control the operation of the various circuits within transceivers 220 and 222. A memory 282 may be coupled to one or more control circuits 284 and may store program code and data for data processor/controller 280. Data processor/controller 280 may be implemented on one or more application specific integrated circuits (ASICs) and/or other ICs.

Figure 3:
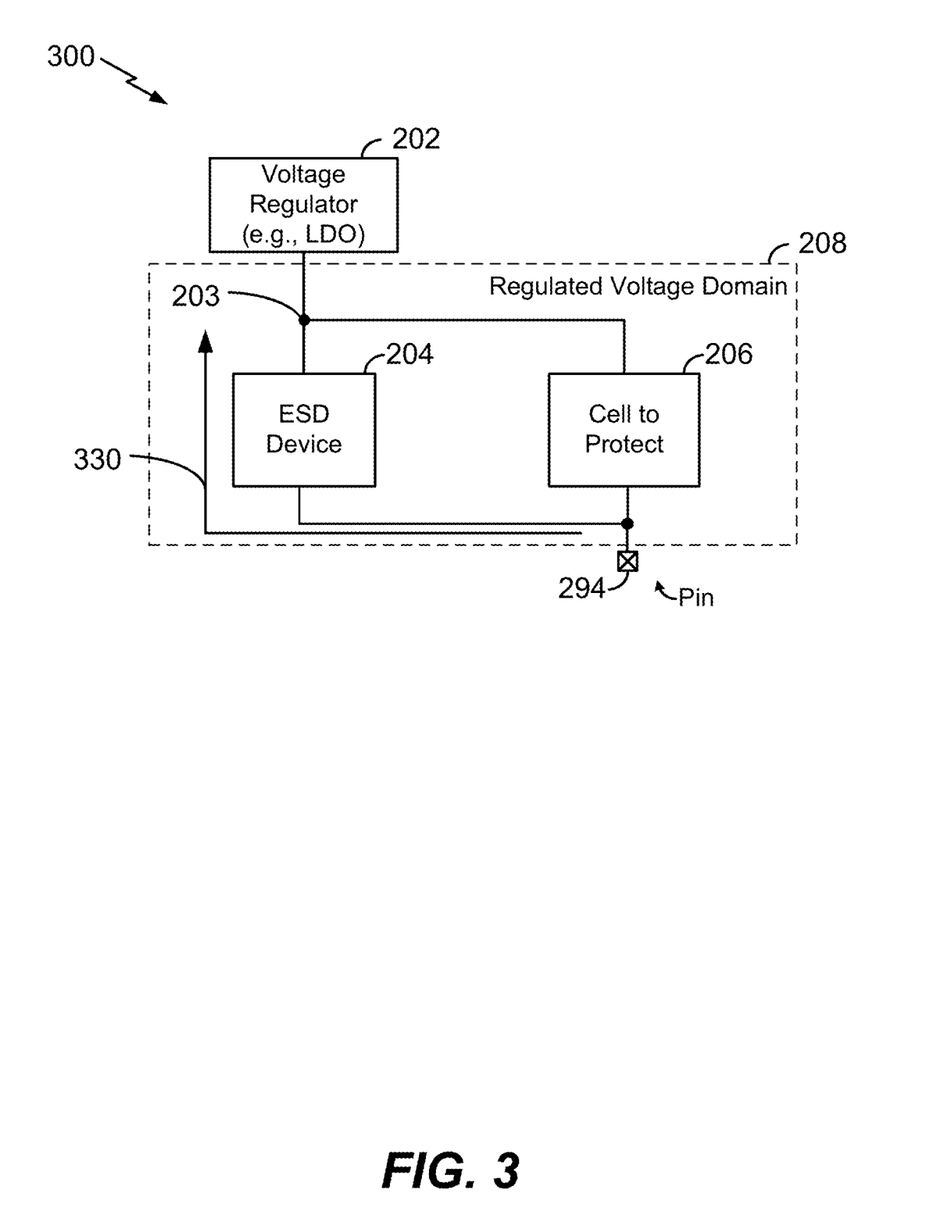
FIG. 3 is a diagram showing an exemplary implementation of an ESD device in a regulated voltage domain.

FIG. 3 illustrates an exemplary device 300 that includes the electrostatic discharge (ESD) device 204 of FIG. 2 coupled to an output of the voltage regulator 202 (e.g., the voltage regulator output node 203 in the regulated voltage domain 208) and to the pin 294, such as an I/O pin. The ESD device 204 is configured to provide a discharge current path 330 that enables an ESD current from the pin 294 to bypass the cell to protect 206. The ESD device 204 may include one or more diodes, one or more ESD protect circuits, or a combination thereof, as described with respect to FIG. 4. In an exemplary implementation, the cell to protect 206 may include analog circuitry in a transceiver, such as described with respect to FIG. 2.

Because the ESD device 204 is coupled to the output of the voltage regulator 202 (e.g., in the regulated voltage domain 208), a leakage current through the ESD device 204 may be reduced as compared to a leakage current of an ESD device that is directly coupled to a power supply. In some implementations, such as described with respect to FIGS. 7-8, the voltage regulator 202 may be configured to reduce a regulated output voltage in a low-power mode or a retention mode of operation, further reducing the leakage current through the ESD device 204. Reduced leakage current enables reduced power consumption and an extended duration of device operation.

Figure 4:
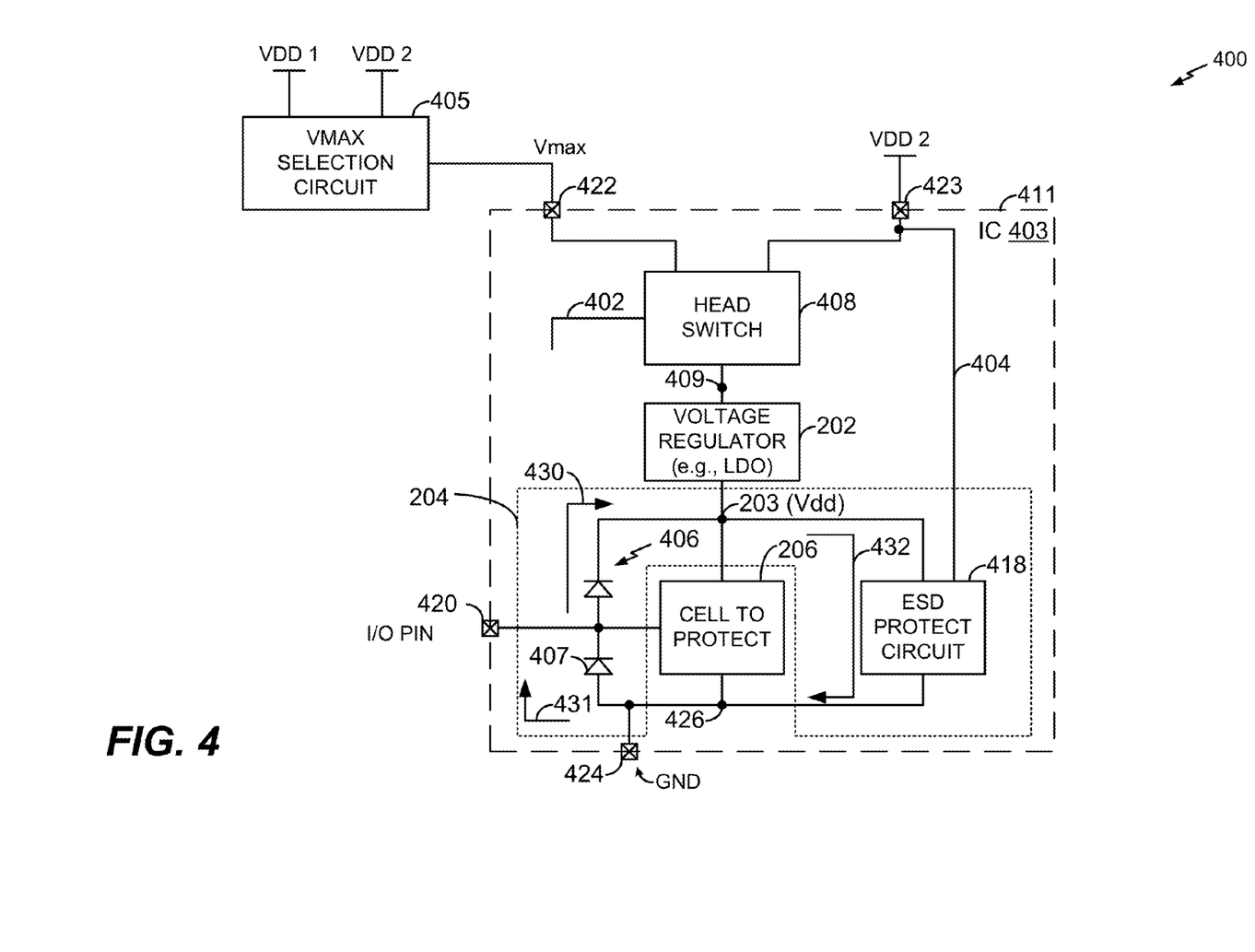
FIG. 4 is a diagram showing an exemplary implementation of an IC with an ESD protection cell and a first protective circuit element under regulation.

FIGS. 4-8 depict exemplary embodiments that provide reduced power consumption by reducing leakage current in circuit elements. As an example, FIG. 4 depicts a circuit that includes ESD devices and circuitry in a power-collapsible portion of the circuit for reduced leakage current during a low-power mode. As used in this description, the term "cell" is intended to refer to a collection of IC elements arranged to perform select functions. For example, an ESD protect cell is a collection of IC elements arranged to detect an ESD event, clamp or fix the input voltage at a circuit to be protected and shunt current to ground.

As described in further detail with respect to FIG. 4, to reduce leakage currents in ICs manufactured with smaller geometries, the ESD device 204 is coupled to the output of the voltage regulator 202 of FIG. 2. The ESD device 204 may include an ESD protect circuit 418 and an ESD protective circuit element (e.g., a diode 406) that are coupled to an output of the voltage regulator 202. The voltage regulator 202 can be a low dropout voltage regulator (LDO) or a general purpose regulator. In addition, the ESD protect circuit 418 is of a design which allows the "clamping" function of the ESD protect circuit 418 to be enabled when the IC is not energized. Stated another way, the ESD protect circuit 418 is disabled when the IC is energized. Application of the improved circuit arrangement in conjunction with I/O signal pins of the IC can significantly reduce leakage current when the IC is in a low-power mode.

Figure 5:
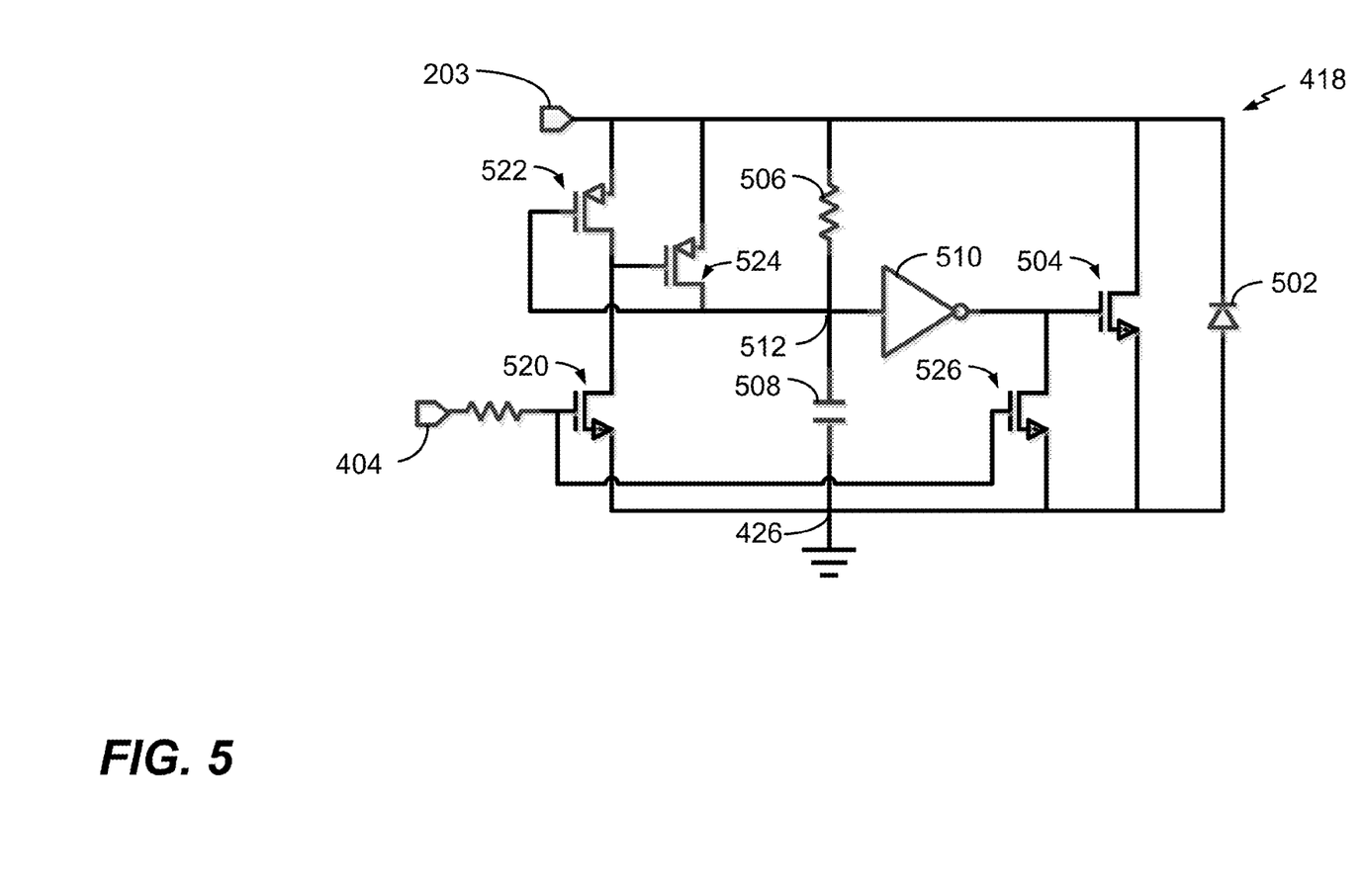
FIG. 5 is a diagram showing an exemplary implementation of the ESD protect cell of FIG. 4.

As described in further detail with respect to FIG. 5, the ESD protect circuit 418 of FIG. 4 may be implemented using a shunt diode and an active clamp with a disable circuit. The disable circuit may be coupled to a power supply outside of the voltage domain that is regulated by the voltage regulator 202 to reduce or prevent leakage current due to relatively fast power-up of the regulated voltage domain.

Figure 6:
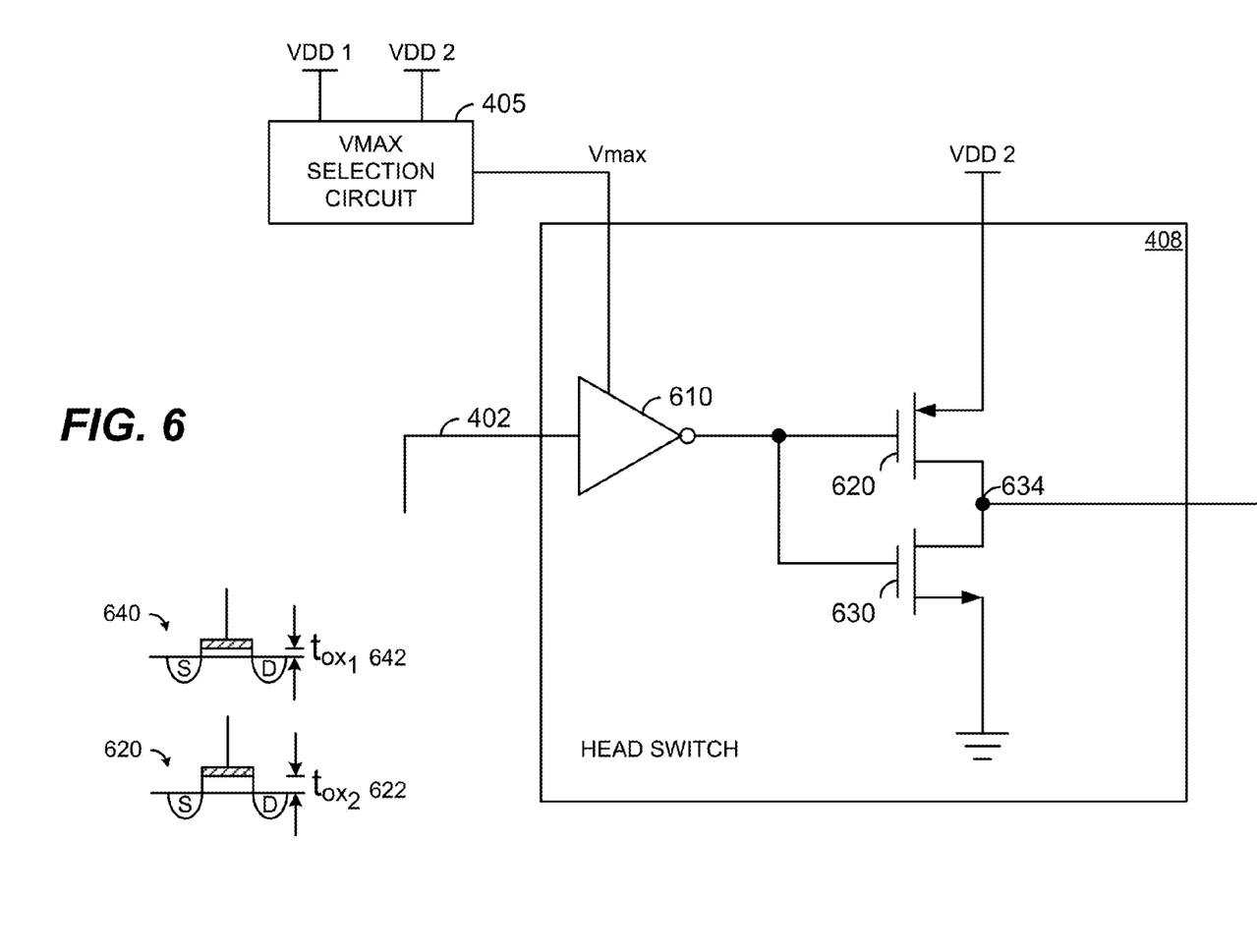
FIG. 6 is a diagram showing an example of the head switch of FIG. 4.

As described in further detail with respect to FIG. 6, a modified head switch 408 may be deployed between input pins and various digital circuit cells or blocks in the IC. In an exemplary embodiment, the modified head switch 408 includes a pMOS transistor 620 with a relatively thicker oxide layer than that used in transistors in conventional head switches that support cells or blocks that are internally power collapsed. The pMOS transistor 620 in the modified head switch 408 includes an oxide layer that is also thicker than oxide layers used in transistors in the cells or blocks.

A first control input of the head switch 408 of FIG. 6 is connected to a nominal or high-power domain supply voltage (VDD 2). A second control input of the head switch receives a voltage (Vmax) that is the higher of a first supply voltage (VDD 1) or the second supply voltage (VDD 2) from a selection circuit 405. A head switch source is connected to a sleep-mode or low-power domain. The input voltage of the low-power domain input has a lower direct-coupled voltage than that of a nominal or high-power domain input coupled to the first control input of the modified head switch 408. In an "off" state, a gate-source junction of a pMOS transistor 620 is reverse biased, a low-power domain input voltage is applied at the drain-source junction, and a pull-down transistor 630 "pulls" the output of the modified switch to ground. The pMOS transistor 620 is a relatively thick oxide device to limit leakage current in the off state. The pull-down transistor 630 (an nMOS transistor) permits very little leakage when it is "on" in the power collapse state. In an "on" state, the pMOS transistor 620 acts like a switch shunting the low-power domain supply input to the output of the modified head switch 408.

Figure 7:
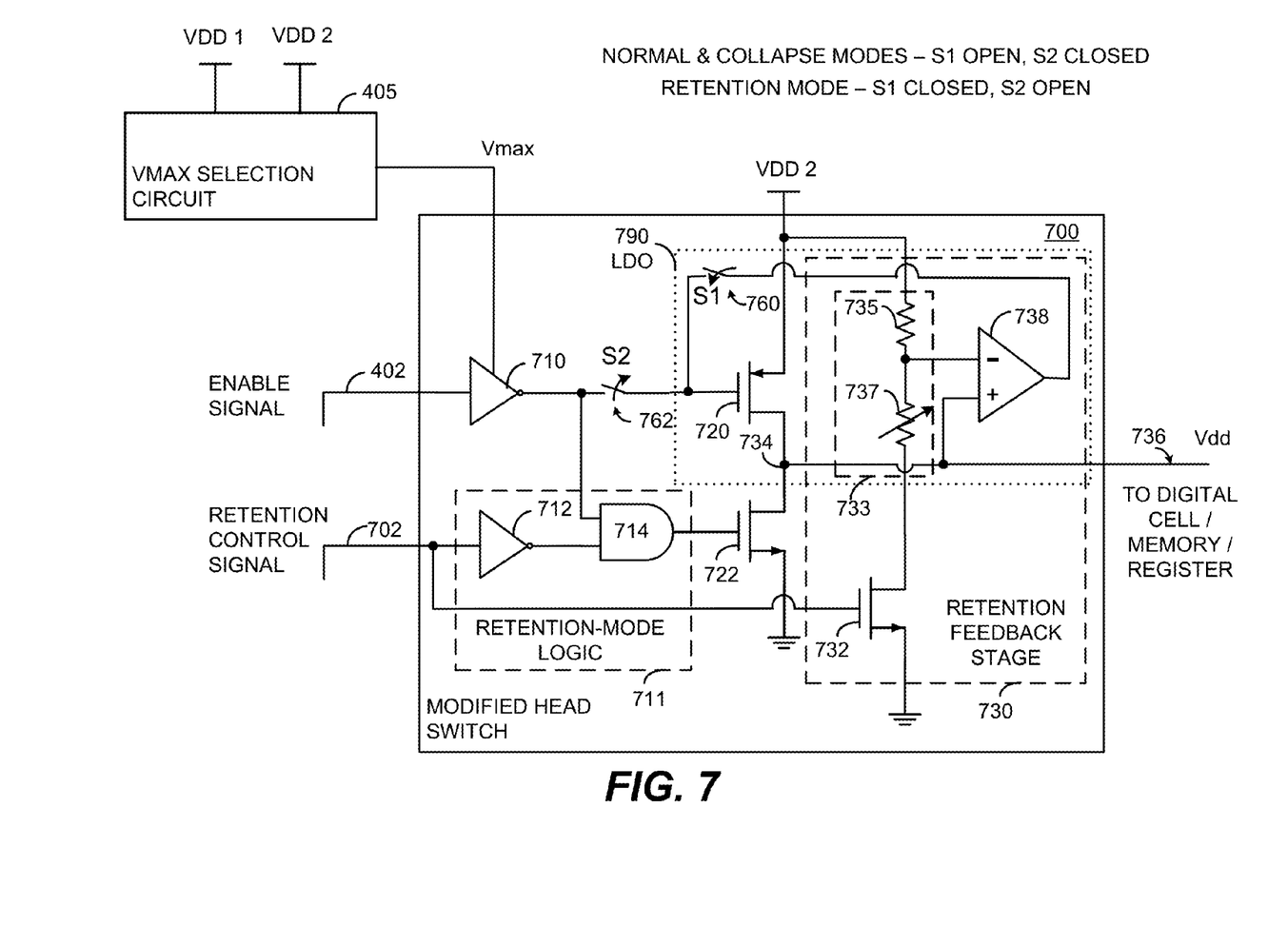
FIG. 7 is a diagram showing exemplary components that may be used in the circuit of FIG. 6.

As described in further detail with respect to FIG. 7, a modified head switch 700 includes retention mode logic 711 and a retention feedback stage 730 to provide a low-power consumption regulator that generates a retention mode output voltage. For example, the modified head switch 700 includes a retention switch (e.g., S1 760) configured to place digital blocks, such as a first memory element 830 and a second memory element 832 of FIG. 8, into a retention mode. The retention mode output voltage is lower than VDD 2 (i.e., the low-power domain input) and may be controllably adjusted to provide a sufficient voltage for select digital cells (e.g., memory elements 830 and 832 of FIG. 8) with one or more registers or memory elements to retain the information stored therein. Retention mode operation of the modified head switch 700 further reduces leakage current while permitting the IC to maintain configuration information in registers or other memory elements in the IC when the IC is operating in a power saving mode. Accordingly, the modified head switch 700 is configured to provide a nominal operating voltage (e.g., VDD 2) or a retention mode voltage with reduced leakage and the capability to provide sufficient energy to maintain circuit configuration information even when the IC is otherwise in an "off" mode. The retention mode operation enables a further reduction in leakage current.

Referring to FIG. 4, an apparatus 400 includes an IC 403 arranged with the ESD device 204 coupled to the output of the voltage regulator 202. The ESD device 204 includes an ESD protective circuit element 406, an ESD protective circuit element 407, and an ESD protect circuit 418 coupled to an output of the voltage regulator 202. For example, the IC 403 may correspond to the transceiver 220 of FIG. 2. The IC 403 further includes a modified head switch 408, arranged with an input node connected to a first supply voltage (e.g., VDD 2), an input node connected to the higher of the two supply voltages provided at the interface 411 of the IC 403, labeled Vmax, a connection (e.g., a control node) 402, and an output node coupled to an input of the voltage regulator 202. VMAX selection circuit 405 receives the first supply voltage (e.g., VDD 2) at a first voltage input and a second supply voltage (e.g., VDD 1) at a second voltage input. The VMAX selection circuit 405 is configured to selectively couple one of the first voltage input and the second voltage input to an output of the VMAX selection circuit 405 to provide the higher of the two received supply voltages or Vmax at the output. The Vmax supply voltage is applied to control the modified head switch 408. Although FIG. 4 illustrates that the apparatus 400 includes the VMAX selection circuit 405 coupled to a pin 422, in other implementations the Vmax selection circuit 405 may be omitted, such as by providing VDD 2 to the pin 422. In an exemplary embodiment, VDD 1 is approximately 1.8V, VDD 2 is approximately 1.0V, and the connection 402 is connected to VDD 1.

The voltage regulator 202 coupled at the output of the modified head switch 408 generates a regulated voltage at an output node that is coupled to a cathode of the ESD protective circuit element 406, an input node of the cell to protect 206, and an input node of the ESD protect circuit 418.

Connector 404 provides VDD 2 to a control node of the ESD protect circuit 418. As described further with respect to FIG. 5, the "clamping" function of the ESD protect circuit 418 is disabled or will not trigger when the IC 403 is energized at the low-voltage level provided by supply voltage VDD 2. Otherwise, when the IC 403 is not energized by an external power source, the ESD protect circuit 418 is enabled and is configured to clamp a transient voltage. Accordingly, the ESD protect circuit 418 is responsive to a control input.

The anode of the ESD protective circuit element 406 is coupled to an I/O pin or signal interface node of the IC 403. A signal interface node is a conductor that traverses a boundary 411 of the improved IC 403 that conveys a signal to the IC 403 or from the IC 403. Power interface nodes convey an input or supply voltage to the improved IC 403. In the IC 403, the pins or conductors labeled VDD 1, VDD 2, and GND are power interface nodes.

Thus, FIG. 4 illustrates a device (e.g., the IC 403) that includes an IC interface (e.g., corresponding to the boundary 411) having multiple pins, such as an input/output (I/O) pin 420. The device includes circuitry, such as analog circuitry (e.g., one or more of the LNAs 240*pa* to 240*pk*, one or more of the PAs 254*pa* to 254*pk*, one or more of the receive circuits 242*pa* to 242*pk*, one or more of the transmit circuits 252*pa* to 252*pk*, or any combination thereof, of FIG. 2) that is to be protected against damage due to electrostatic discharge (ESD) occurring between pins of the IC interface. A voltage regulator (e.g., the voltage regulator 202) is configured to output a regulated voltage at a voltage regulator output node 203, illustrated as a supply voltage (Vdd) node or pin. For example, the voltage regulator may include a low dropout voltage regulator (LDO).

An electrostatic discharge device (e.g., the ESD protective circuit element 406) is coupled to the I/O pin 420 and is further coupled to the voltage regulator. The electrostatic discharge device may include a diode having a first terminal coupled to the I/O pin 420 and a second terminal coupled to the voltage regulator output node 203. The electrostatic discharge device may be configured to provide a discharge current path 430 between the I/O pin 420 and the voltage regulator output node 203.

The device (e.g., the IC 403) includes a head switch (e.g., the modified head switch 408). The voltage regulator 202 is coupled to an output 409 of the head switch. The head switch may be responsive to an enable signal (e.g., at the connection 402). The head switch may be selectively closed in response to the enable signal to provide a voltage supply to the voltage regulator.

The device may include an optional voltage selection circuit (e.g., the VMAX selection circuit 405). The voltage selection circuit may include a first voltage input and a second voltage input. The first voltage input may be responsive to a first voltage (e.g., VDD1), and the second voltage input may be responsive to a second voltage (e.g., VDD2). The voltage selection circuit may be configured to detect which voltage received at the first voltage input and the second voltage input is greater, and to provide the detected greater voltage to a voltage selection circuit output at the pin 422. For example, the voltage selection circuit may be configured to detect and output the greater voltage of the first voltage and the second voltage as an output voltage ("Vmax").

The device may include a second electrostatic discharge device 407 coupled to the I/O pin 420 and to a ground pin 424 to provide a second discharge current path 431 between the I/O pin 420 and the ground pin 424. The device may include an electrostatic discharge device that includes an electrostatic discharge protection circuit (e.g., the ESD protect circuit 418) coupled to the voltage regulator output node 203 and to the ground pin 424 via a ground node 426 to provide a third discharge current path 432 between the voltage regulator output node 203 and the ground pin 424. The electrostatic discharge protection circuit may be coupled to a voltage input (e.g., a pin) 423 via a connector 404 that may disable an active clamp circuit of the ESD protect circuit 418 when VDD 2 is provided to the voltage input 423, such as described in further detail with reference to FIG. 5. The ESD device 204 including the electrostatic discharge device 406, the second electrostatic discharge device 407, and the electrostatic discharge protection circuit 418 may provide electrostatic discharge paths (e.g., the electrostatic discharge paths 430, 431, 432) that bypass circuitry (e.g., the cell to protect 206) that is coupled to the voltage regulator output node 203, to the I/O pin 420, and to the ground pin 424. Implementing ESD protection circuitry in a power collapsible domain reduces power consumption due to leakage current through the ESD protection circuitry while in a low-power mode.

FIG. 5 is a diagram of an exemplary implementation of the ESD protect circuit 418 of FIG. 4. The ESD protect circuit 418 provides an electrostatic discharge path from the ground node 426 of FIG. 4 to the voltage regulator output node 203 via a diode 502. The ESD protect circuit 418 also selectively provides an electrostatic discharge path from the voltage regulator output node 203 to the ground node 426 via a shunt transistor 504. Operation of the shunt transistor 504 may be disabled in response to voltage applied via the connector 404 while the IC 403 of FIG. 4 is energized (receiving the voltage VDD 2 via pin 423 of FIG. 4). Disabling operation of the shunt transistor 504 while the IC 403 is energized may reduce leakage current though the shunt transistor 504.

The diode 502 is coupled between the voltage regulator output node 203 and the ground node 426 that is coupled to the ground pin 424 of FIG. 4. The diode 502 provides a discharge current path from the ground node 426 to the voltage regulator output node 203. The shunt transistor 504 is configured to provide a discharge current path from the voltage regulator output node 203 to the ground node 426 when activated.

A control circuit includes a resistor 506 coupled between the voltage regulator output node 203 and a control node 512, a capacitor 508 coupled between the control node 512 and the ground node 426, and an inverter 510 having an input coupled to the control node 512 and an output coupled to the gate of the shunt transistor 504. When a supply voltage (VDD) is provided at the voltage regulator output node 203, the voltage at the control node 512 increases from ground toward VDD as the capacitor 508 charges according to a resistive-capacitive (RC) charging characteristic. When the voltage at the control node 512 reaches a switching voltage of the inverter 510, the inverter 510 outputs a low voltage (e.g., ground), causing the shunt transistor 504 to be in a deactivated (e.g. non-conducting) state. When no supply voltage is provided at the voltage regulator output node 203, an ESD voltage pulse (e.g., a brief pulse of several kilovolts) applied between the voltage regulator output node 203 and the ground node 426 causes a pull-up device (e.g., a pMOS transistor) in the inverter 510 to conduct and to provide an activation voltage to the shunt transistor 504. The shunt transistor 504 is configured to provide the ESD discharge path 432 depicted in FIG. 4 in response to receiving the activation voltage.

A disable circuit includes a transistor 520 responsive to the voltage (e.g., VDD 2) at the connector 404 of FIG. 4 and also includes pMOS transistors 522, 524. When the transistor 520 is activated, the pMOS transistor 524 activates to provide another charging path to the control node 512, enabling the control node 512 to charge more quickly than the RC charging characteristic. In addition, a pull-down transistor 526 is responsive to the voltage at the connector 404 to couple the gate of the shunt transistor 504 to the ground node 426. If the voltage at the voltage regulator output node 203 rises faster than the voltage at the control node 512, the shunt transistor 504 can activate and shunt current from the voltage regulator output node 203 to ground until the voltage at the control node 512 reaches the switching voltage of the inverter 510. However, providing a disable signal (e.g., VDD 2) at the connector 404 prevents the shunt transistor 504 from activating. As a result, current through the shunt transistor 504 may be reduced or eliminated, reducing power consumption during power-up of a regulated voltage domain of the voltage regulator 202.

FIG. 6 is a diagram showing an embodiment of the modified head switch 408 introduced in FIG. 4. The modified head switch 408 includes an inverter 610, a pMOS transistor 620 and an nMOS transistor 630. A signal input of the inverter 610 is connected to the connection 402. As described, a control input (i.e., an enable/disable input of the inverter 610 is connected to VDD 1 or another signal source that directs the modified head switch 408 to enable or disable. The signal output of the inverter 610 is connected to the respective gate nodes of the pMOS transistor 620 and the nMOS transistor 630. The inverter 610 is energized or enabled by Vmax, which is the higher in voltage of VDD 1 or VDD 2. The source node of the pMOS transistor 620 is connected to VDD 2. The drain node of the nMOS transistor 630 is connected to ground. The output node of the head switch 408 is connected to the drain of the pMOS transistor 620 and the source of the nMOS transistor 630.

When the voltage on the connection 402 is below a threshold of the inverter 610 and Vmax has enabled the inverter 610, the internal node coupled to the output of the inverter 610 and the gates of the pMOS transistor 620 and the nMOS transistor 630 is driven to a logic high voltage that exceeds VDD 2. In this "off" mode, the gate-source junction of the pMOS transistor 620 is reverse biased, the pMOS transistor 620 is not conducting and the nMOS transistor 630 pulls the head switch output Vdd to ground. Under these conditions, the drain to source junction of the pMOS transistor 620 is approximately VDD 2. Leakage current in this mode of operation is reduced by arranging the pMOS transistor 620 with a relatively thick oxide layer. The pMOS transistor 620 and the nMOS transistor 630 are arranged with an oxide layer that is thicker than that of transistors in the analog cells, digital cells, and voltage regulator 202 that are energized by the modified head switch 408.

When the voltage on the connection 402 is above a threshold of the inverter 610 and Vmax has enabled the inverter 610, the internal node coupled to the output of the inverter 610 and the gates of the pMOS transistor 620 and the nMOS transistor 630 is driven to a logic low voltage that is lower than VDD 2. In this "on" mode, the pMOS transistor 620 acts as a switch and provides an output Vdd that approximates VDD 2. In the "on" mode, the nMOS transistor 630 is reverse biased and draws little or no leakage current.

Thus, FIG. 6 illustrates an exemplary embodiment in which a head switch (e.g., the modified head switch 408) includes an inverter (e.g., the inverter 610), a pull-up transistor (e.g., the pMOS transistor 620), and a pull-down transistor (e.g., the nMOS transistor 630). The inverter may have an input coupled to receive an enable signal, such as the enable signal received via the connection 402 of FIG. 4. The pull-up transistor may be coupled to the pull-down transistor at a head switch output node 634 (e.g., corresponding to the output 409 of FIG. 4). The pull-up transistor and/or the pull-down transistor may have a first oxide thickness, illustrated as a first oxide thickness tox2 622 of the pMOS transistor 620. For example, the first oxide thickness tox2 622 of the pull-up transistor may be larger than a second oxide thickness tox1 642 of a representative transistor 640 that is included in circuitry that is powered by the regulated voltage provided by the voltage regulator 202. For example, the representative transistor 640 may be in the cell to protect 206. The first oxide thickness 622 being larger than the second oxide thickness 642 reduces a leakage current of the pull-up transistor when the pull-up transistor is in an inactive state.

FIG. 7 is a diagram showing an alternative embodiment of one or more components of the circuit of FIG. 4 incorporated into a head switch 700. The head switch 700 includes the elements of the modified head switch 408 augmented by retention-mode logic 711, switches S1 760 and S2 762, and a feedback stage 730. Thus, the modified head switch 700 includes an inverter 710, a pMOS transistor 720 and an nMOS transistor 722. The head switch 700 is configured to receive an enable signal at the connection 402 and a retention control signal at a connection (e.g., a control node) 702. The head switch 700 includes retention mode logic circuitry 711 and a retention feedback stage 730. The retention feedback stage 730 is responsive to the retention mode logic circuitry 711 and is responsive to the enable signal that is received via the connection 402 and that is provided to the inverter 710. A signal input of the inverter 710 is connected to the connection 402. A control input (i.e., an enable/disable input of the inverter 710) is connected to Vmax. The signal output of the inverter 710 is connected to an input of AND gate 714 and is further connected to the gate node of the pMOS transistor 720 when switch S2 762 is closed. The source node of the pMOS transistor 720 is connected to VDD 2. The source node of the nMOS transistor 722 is connected to ground. The drain node of nMOS 722 is connected to drain node of pMOS 720.

Retention-mode logic 711 includes an inverter 712 and the AND gate 714. A signal input of the inverter 712 receives the retention-mode enable signal on connection 702 and forwards the inverse of the retention-mode enable signal to an input of the AND gate 714. The remaining input of the AND gate 714 is coupled to the signal output of the inverter 710 and the gate node of the pMOS transistor 720.

Switch S1 760 is connected with the output node of an amplifier, such as an operational transconductance amplifier (OTA) 738. When switch S1 760 is closed, the output node of the OTA 738 is coupled to the gate of pMOS transistor 720. Switch S2 762 is connected between the output node of the inverter 710 and the gate of the pMOS transistor 720. The switches S1 760 and S2 762 are controllably opened and closed as a logical function of the head switch enable signal on connection 402 and the retention-mode enable signal on connection 702. When switch S1 760 is closed, switch S2 762 is open and vice-versa.

In a normal mode of operation, switch S1 760 is open, switch S2 762 is closed, and the voltage Vdd on the output node of the modified head switch 700 approximates VDD 2. In a collapse mode of operation, the switch S1 760 is open, switch S2 762 is closed, and Vdd or the voltage on the output node of the modified head switch 700 is pulled to ground. In the retention mode, switch S1 760 is closed, switch S2 762 is open, and the voltage Vdd on the output node of the modified head switch 700 is controllably adjusted to a voltage below VDD 2 but still above a threshold voltage below which stored voltages will no longer be retained in a circuit that is energized by the modified head switch 700.

The feedback stage 730 includes an nMOS transistor 732, a resistor network 733, and the OTA 738. The feedback stage 730 is coupled between VDD 2 and ground. The feedback stage 730 receives the retention-mode enable control signal on connection 702, which is coupled to the gate node of the nMOS transistor 732. The resistor network (e.g., a voltage divider) 733 is coupled to VDD 2 at a first input and the source of the nMOS transistor 732 at an opposed input. A positive signal input of the OTA 738 is connected the output node, which is further coupled to the drain of the pMOS transistor 720 and the source of the nMOS transistor 722. A negative signal input of the OTA 738 is coupled to a node between resistor 735 and resistor 737 in the resistor network 733. As further indicated in FIG. 7, the output node of the OTA 738 is connected to the gate of the pMOS transistor 720, the output of the inverter 710 and a signal input of the AND gate 714. Operation of the OTA 738 may be enabled when the retention-mode enable signal is present on connection 702 and may be disabled when the retention-mode enable signal is not present on connection 702.

In an example implementation, when the retention-mode enable signal on connection 702 is not present, the nMOS transistor 732 is off, operation of the OTA 738 is disabled, S1 760 is open, S2 762 is closed, and the pMOS transistor 720 and nMOS transistor 722 provide a Vdd_out that approximates VDD 2. When the retention-mode enable signal is present on connection 702, operation of the OTA 738 is enabled, S1 760 is closed, S2 762 is open, the nMOS transistor 732 is on, and current flows through the resistor network 733. The relative resistance values of the resistor 735 and the resistor 737 determines the change in VDD 2 that is provided at the negative input of the OTA 738.

As indicated in FIG. 7, the resistance of resistor 737 is controllably adjustable to adjust the voltage of Vdd_out. Modification of the resistance of resistor 737 permits real-time control of Vdd_out through software or firmware (not shown). Programmability may be realized through control of bypass and in series coupled switches between different nodes of a resistive ladder and the negative input of OTA 738.

In an example of operation, the retention feedback stage 730 is coupled to the switching device 760 (S1) and is configured to selectively provide a retention feedback signal from the retention feedback stage 730 to a gate of the pull up transistor 720. The pull up transistor 720 is configured to set an output voltage at the output node 734 of the head switch 700 to a retention voltage level. For example, the amplifier 738 of the retention feedback stage 730 provides an output to a gate of the pull up transistor 720 when the switch 760 (S1) is closed. In this configuration, when the switch 760 (S1) is closed, the output of the retention feedback stage 730 drives the gate of the pull up transistor 720, thereby setting the voltage level of the head switch node 734 to the retention feedback stage voltage level. The retention feedback stage voltage level at the node 734 provides an input to the amplifier 738 and also provides the output 736 to a digital cell/memory/register as illustrated. The amplifier 738 is a differential amplifier and provides a comparison function between the positive input terminal which receives the voltage of the input node 734 and a negative input terminal coupled to a node between a first resistor 735 and a second resistor 737.

In a particular illustrative example, the second resistor 737 is a variable resistor that may be programmably controlled in order to adjust the voltage provided to the negative terminal of the differential amplifier 738. The retention feedback stage 730 includes a voltage divider 733 which includes the first resistor 735 and the second resistor 737, as illustrated. The voltage divider 733 is coupled to a first input of the differential amplifier 738 and to the second input of the differential amplifier 738.

In a retention mode, the first switch 760 (S1) is closed and the second switch 762 (S2) is open. In the retention mode, the output of the differential amplifier 738 drives the input gate of the pull up transistor 720 and creates a feedback retention path, as previously described. In a normal operational mode (non-retention mode), the first switch 760 (S1) is open and the second switch 762 (S2) is closed. In the normal operational mode, an enable signal at the connection 402 is provided to the inverter 710 which drives the pull up transistor 720. When the enable signal is active, the output of the inverter 710 turns on the pull up transistor 720 and also provides an active signal via the AND logic 714 to turn on the pull down transistor 722. In this arrangement, the voltage from the second voltage supply VDD 2 is provided as the output voltage 736 (VDD).

As illustrated in FIG. 7, the amplifier 738, the switch S1 760, and the pull-up transistor 720 form a LDO 790 that is operational when the retention mode is enabled. In other implementations, the head switch 700 may include additional circuitry to provide regulation of the output voltage

736 during a normal (non-retention) mode. For example, the head switch 700 may include another LDO (in addition to or instead of the LDO 790) that is enabled in the normal mode. The head switch 700 may be implemented in the IC 403 of FIG. 4 and may replace the head switch 408 and the voltage regulator 202 of FIG. 4. Alternatively, or in addition, the head switch 700 may be used in a system that includes digital components, such as memory elements, as described in further detail with respect to FIG. 8.

Figure 8:
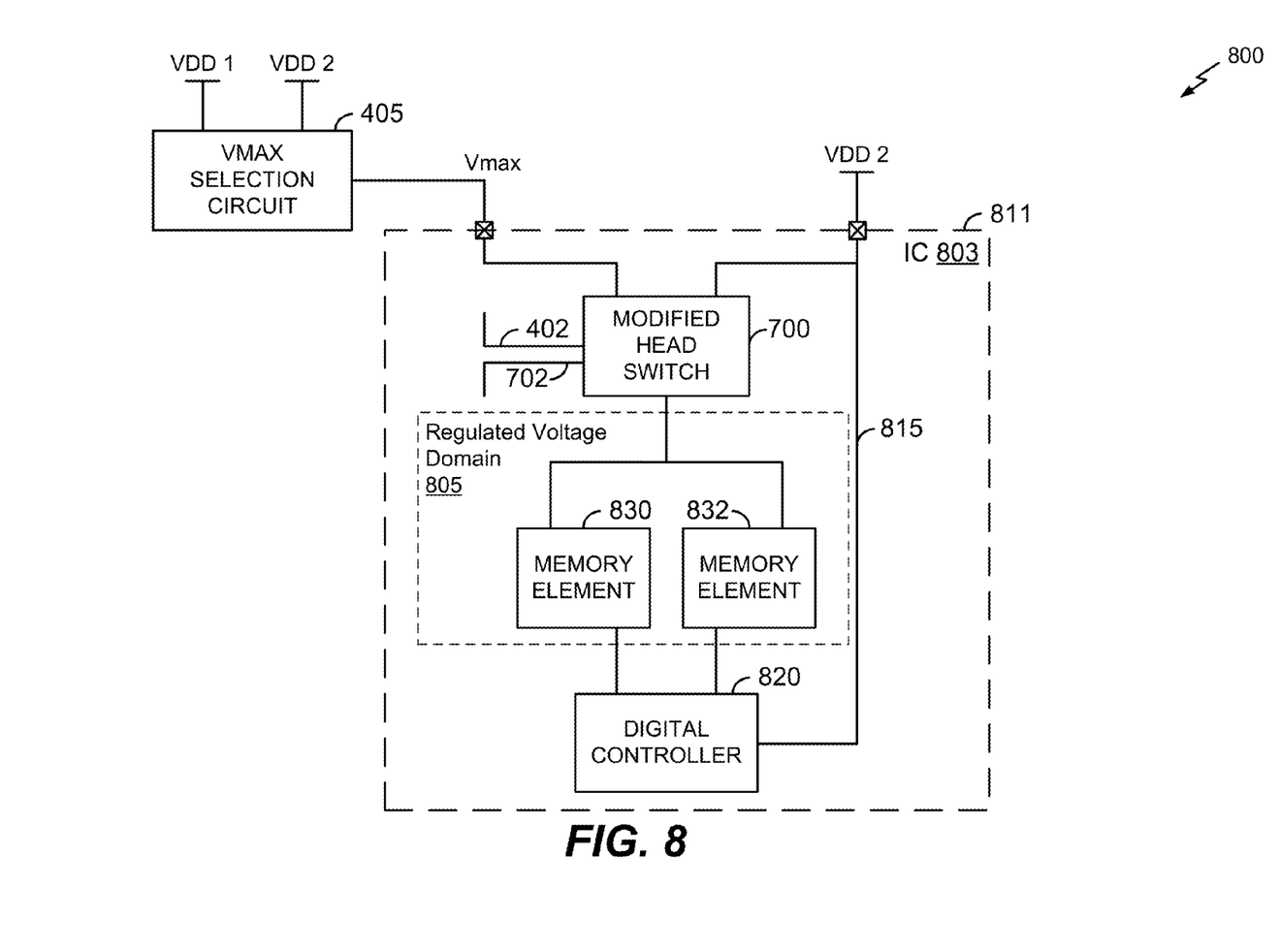
FIG. 8 is a diagram showing an example of an IC including the head switch of FIG. 7.

FIG. 8 is a diagram showing an embodiment of an apparatus 800 that includes an integrated circuit 803 including the modified head switch 700 or low-power regulator of FIG. 7. The modified head switch 700 is arranged to receive supply voltage VDD 1 and supply voltage VDD 2. As described, the modified head switch 700 receives a head switch enable control signal on connection 402 and a retention-mode control signal on connection 702.

The integrated circuit 803 further includes one or more digital circuits, such as a memory element 830 and a memory element 832 that are in a regulated voltage domain 805 that is powered by the modified head switch 700. The memory elements 830, 832 are arranged to receive one of supply voltage VDD 2, a retention-mode voltage generated by the modified head switch 700, and an off-mode input voltage, which is below the retention-mode voltage. When both the head switch enable control signal and retention-mode control signal are present at the respective connections of the modified head switch 700, the retention-mode voltage or Vdd_out is generated by the modified head switch 700 or low-power regulator. When one of the two resistance values of the resistors in the resistor network 733 (FIG. 7) is adjusted, the retention-mode voltage can be controllably lowered from VDD 2 to a threshold voltage beyond which the memory element 830 and the memory element 832 will no longer be able to maintain a stored voltage. For example, when VDD 2 is approximately 1.0V the retention-mode voltage can be programmatically stepped in desired increments towards the threshold voltage. With each step, Vdd_out falls, resulting in a reduction in leakage current.

As further illustrated in FIG. 8, a digital controller 820 is outside of the regulated voltage domain 805 and receives supply voltage VDD 2 from connection 815. In this way, the digital controller 820 may remain on to be available to read information stored in the memory element 830 or in the memory element 832. Thus, the integrated circuit 803 is capable of storing configuration information under conditions when the remainder of the IC 803 is off. The modified head switch 700 or low-power regulator of FIG. 7 may be deployed in an IC design to reduce leakage current while still retaining configuration information to return to a nominal operating mode from a sleep mode.

Figure 9:
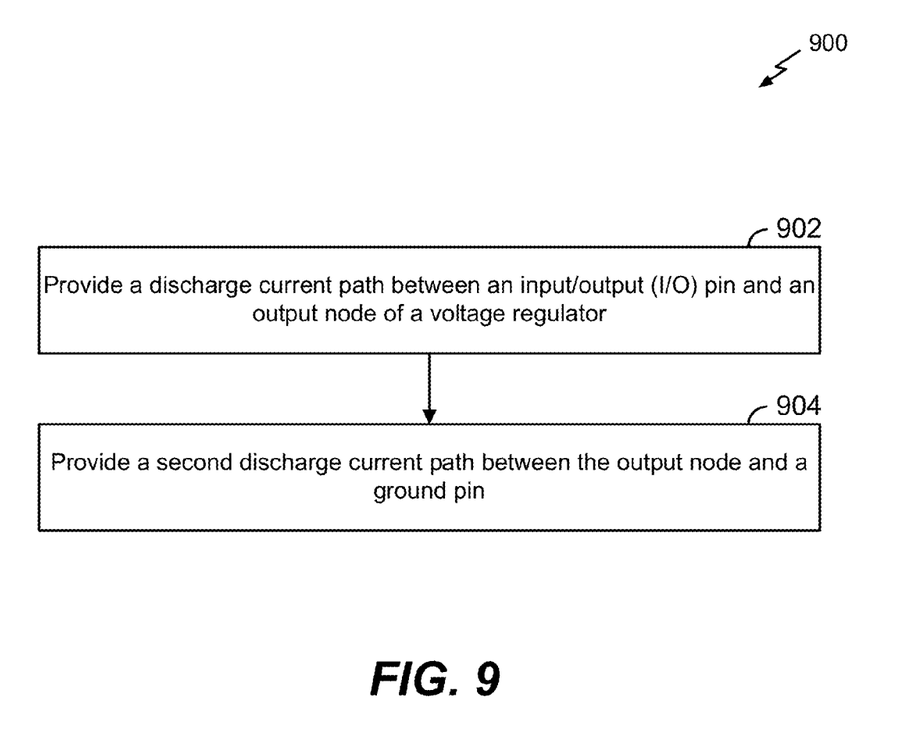
FIG. 9 is a flow chart that illustrates a method of operating an IC with an ESD protection cell and a first protective circuit element under regulation.

Referring to FIG. 9, an exemplary embodiment of a method is depicted and generally designated 900. The method 900 may be performed in a wireless device, such as the wireless device 110 of FIG. 1.

The method 900 includes providing a discharge current path (e.g., the discharge current path 430) between an input/output (I/O) pin (e.g., the pin 294 of FIG. 2-3, the I/O pin 420 of FIG. 4) and an output node (e.g., the voltage regulator output node 203) of a voltage regulator, such as the voltage regulator 202, at 902.

The method 900 further includes providing a second discharge current path between the output node and a ground pin, at 904. The second discharge path may be provided via an ESD protection element, such as a device or circuit. For example, the second discharge current path may correspond to the discharge path 432 through the ESD protect circuit 418 of FIG. 3. The second discharge current path may be selectively disabled via a control signal when a supply voltage (e.g., VDD 2 of FIG. 4) is provided to an IC that includes the I/O pin and the ground pin (e.g., via operation of the disable circuit described with respect to FIG. 5).

The method 900 may include providing a third discharge current path between the I/O pin and the ground pin. The third discharge path may be provided via an ESD protection element, such as a device or circuit. For example, the third discharge current path may correspond to discharge current path 431, and the ground pin may correspond to the ground pin 424 of FIG. 4.

The method 900 may optionally further include selectively coupling the voltage regulator to a supply voltage by controlling a pull-up transistor and a pull-down transistor. For example, the pull-up transistor may correspond to the pull-up transistor 620 of FIG. 6 or the pull-up transistor 720 of FIG. 7, and the pull-down transistor may correspond to the pull-down transistor 630 of FIG. 6 or the pull-down transistor 722 of FIG. 7.

Although FIG. 9 depicts a particular order of elements of the method 900, it should be understood that, in other embodiments, elements of the method 900 may be performed in another order. In addition, two or more (or all) of the elements of the method 900 may be performed simultaneously or substantially simultaneously.

In conjunction with the described devices and methods, an apparatus includes means for conducting an input/output (I/O) signal. For example, the means for conducting the I/O signal may correspond to the pin 294 of FIGS. 2-3, the I/O pin 420 of FIG. 4, one or more other conductive structures, or any combination thereof, as illustrative, non-limiting examples.

The apparatus includes means for discharging an electrostatic charge along a discharge current path between the means for conducting and a voltage regulator output node. For example, the means for discharging may include ESD device 204 of FIG. 2-4, the diode 406 of FIG. 4, the ESD protect circuit 418 of FIGS. 4-5, one or more other ESD devices, or any combination thereof, as illustrative, non-limiting examples.

The apparatus may also include means for selectively providing a supply voltage. The means for selectively providing the supply voltage may include means for selectively coupling an output node to a voltage supply terminal and means for selectively coupling the output node to a ground terminal. For example, the means for selectively providing the supply voltage may correspond to the head switch 408 of FIG. 4 or FIG. 5, the head switch 700 of FIG. 7, one or more other switching devices, or any combination thereof, as illustrative, non-limiting examples. The means for selectively coupling the output node to the voltage supply terminal may include the pull-up transistor 620 of FIG. 6, the pull-up transistor 720 of FIG. 7, one or more other pull-up devices, or any combination thereof. The means for selectively coupling the output node to a ground terminal may include the pull-down transistor 630 of FIG. 6, the pull-down transistor 722 of FIG. 7, one or more other pull-down devices, or any combination thereof. The means for selectively coupling the output node to the voltage supply terminal may have a first oxide thickness (e.g., tox2 622 of FIG. 6) that is larger than a second oxide thickness (tox1 642 of FIG. 6) of a transistor of circuitry that is powered by a regulated voltage output of the voltage regulator (e.g., voltage regulator 202).

The apparatus may include means for providing a control signal to the means for selectively coupling the output node to the ground terminal. The means for providing the control signal may be responsive to an enable signal and further responsive to a retention control signal. For example, the means for providing the control signal may correspond to the retention mode logic 711 of FIG. 7, one or more other control signal circuits, or any combination thereof.

In an exemplary embodiment, the circuit arrangements and head switch modifications described herein may be implemented in one or more instances on one or more ICs, analog ICs, RFICs, mixed-signal ICs, ASICs, printed circuit boards (PCBs), electronic devices, etc. The circuit arrangements and modified head switch may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An electronic device including one or more ICs with the described circuit arrangements and modified head switch described herein may be a stand-alone device or may be part of a larger device. That is, a device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the described functions may be enabled by control signals generated in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

What is claimed is:

1. An apparatus comprising:
   an input/output (I/O) pin;
   circuitry;
   a head switch including a first transistor, wherein the voltage regulator is coupled between the head switch and the circuitry, wherein the first transistor has a first oxide thickness that is greater than a second oxide thickness of a transistor of the circuitry; and wherein the circuitry is powered by the voltage regulator; and
   an electrostatic discharge device coupled to the I/O pin and coupled to the voltage regulator.

2. The apparatus of claim 1, wherein the voltage regulator is coupled to a voltage regulator output node and wherein the electrostatic discharge device includes a diode having a first terminal coupled to the I/O pin and a second terminal coupled to the voltage regulator output node.

3. The apparatus of claim 2, further comprising a voltage selection circuit including a first voltage input and a second voltage input, the voltage selection circuit configured to selectively couple one of the first voltage input and the second voltage input to a voltage selection circuit output.

4. The apparatus of claim 1, wherein the voltage regulator is coupled to a voltage regulator output node and wherein the electrostatic discharge device includes an electrostatic discharge protection circuit coupled to the voltage regulator output node and coupled to a ground pin, the ground pin coupled to the I/O pin via a second electrostatic discharge device.

5. The apparatus of claim 1, wherein the voltage regulator is coupled to a voltage regulator output node and wherein the electrostatic discharge device comprises:
   a diode having a first terminal coupled to the I/O pin and a second terminal coupled to the voltage regulator output node; and
   an electrostatic discharge protection circuit coupled to the voltage regulator output node and coupled to a ground pin that is coupled to the I/O pin.

6. The apparatus of claim 1, a wherein the head switch includes a pull-up transistor and a pull-down transistor, the pull-up transistor coupled to the pull-down transistor at an output node of the head switch.

7. The apparatus of claim 6, wherein the first transistor includes the pull-up transistor.

8. The apparatus of claim 6, wherein the first transistor includes the pull-down transistor.

9. The apparatus of claim 6, wherein the head switch includes a retention switch configured to place digital blocks into a retention mode.

10. The apparatus of claim 6, wherein the voltage regulator is coupled to an output of the head switch.

11. The apparatus of claim 6, wherein the head switch further comprises an inverter having an input coupled to receive an enable signal, the inverter further having an output coupled to the pull-up transistor and coupled to the pull-down transistor.

12. The apparatus of claim 6, wherein the head switch includes a retention mode logic circuit responsive to an enable signal and further responsive to a retention control signal, and wherein an output of the retention mode logic circuit is coupled to the pull-down transistor.

13. The apparatus of claim 12, wherein the head switch includes a retention feedback stage coupled to a switching device, the switching device configured to selectively provide a retention feedback signal from the retention feedback stage to a gate of the pull-up transistor, and wherein the pull-up transistor is configured to set an output voltage at the output node of the head switch to a retention voltage level.

14. The apparatus of claim 13, wherein the retention feedback stage includes a voltage divider coupled to a first input of a differential amplifier, and wherein a second input of the differential amplifier is coupled to the output node of the head switch.

15. The apparatus of claim 1, wherein the electrostatic discharge device is configured to provide a discharge current path between the I/O pin and a voltage regulator output node of the voltage regulator.

16. The apparatus of claim 1, wherein the voltage regulator includes a low dropout voltage regulator (LDO).

17. An apparatus comprising:
means for conducting an input/output (I/O) signal;
circuitry;
means for generating a regulated voltage;
means for selectively providing a supply voltage including means for selectively coupling an output node to a terminal, the means for generating the regulated voltage being coupled between the means for selectively coupling and the circuitry, the means for selectively coupling having a first oxide thickness that is greater than a second oxide thickness of a transistor of the circuitry, the circuitry powered by the means for generating by the regulated voltage; and
means for discharging an electrostatic charge along a discharge current path between the means for conducting and the means for generating the regulated voltage.

18. The apparatus of claim 17, wherein the terminal includes a voltage supply terminal or a ground terminal.

19. The apparatus of claim 1, wherein the head switch is coupled via the voltage regulator to the electrostatic discharge device.

20. The apparatus of claim 1, wherein the electrostatic discharge device includes a disable circuit and a clamp circuit, the disable circuit configured to disable the clamp circuit in response to receiving a disable signal.

* * * * *